(12) United States Patent
Tai et al.

(10) Patent No.: US 9,356,060 B2
(45) Date of Patent: May 31, 2016

(54) IMAGE SENSOR DEVICE AND METHOD

(71) Applicant: Taiwan Semiconductor Manufacturing Company, Ltd., Hsin-Chu (TW)

(72) Inventors: Chih-Ho Tai, Tainan (TW); Po-Jung Chiang, Zhongli (TW); Bo-Chang Su, Tainan (TW); Chi-Feng Chen, Tainan (TW); Jung-I Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/907,486

(22) Filed: May 31, 2013

(65) Prior Publication Data

US 2014/0264701 A1 Sep. 18, 2014

Related U.S. Application Data

(60) Provisional application No. 61/778,170, filed on Mar. 12, 2013.

(51) Int. Cl.
*H01L 27/146* (2006.01)

(52) U.S. Cl.
CPC .... *H01L 27/14623* (2013.01); *H01L 27/14685* (2013.01)

(58) Field of Classification Search
CPC ............ H01L 27/14643; H01L 31/02164; H01L 27/146; H01L 27/14601; H01L 27/1462; H01L 31/02162
See application file for complete search history.

(56) References Cited

U.S. PATENT DOCUMENTS

| | | | |
|---|---|---|---|
| 2004/0041932 A1* | 3/2004 | Chao et al. | 348/308 |
| 2007/0012971 A1* | 1/2007 | Lim | 257/292 |
| 2013/0037700 A1* | 2/2013 | Michiyama et al. | 250/208.2 |
| 2013/0221465 A1* | 8/2013 | Kim | H01L 27/14636 257/432 |
| 2014/0120653 A1* | 5/2014 | Zhao | H01L 31/0232 438/70 |

\* cited by examiner

*Primary Examiner* — Jae Lee
(74) *Attorney, Agent, or Firm* — Slater Matsil, LLP

(57) ABSTRACT

A system and method for blocking light from regions around a photodiode in a pixel of an image sensor is provided. In an embodiment a first optical block layer is formed on a first glue layer and a second glue layer is formed on the first optical block layer. The formation of the first optical block layer and the second glue layer is repeated one or more times to form multiple optical block layers and multiple glue layers. As such, if voids open up in the optical block layers during further processing, there is another optical block layer to block any light that may have penetrated through the void.

20 Claims, 7 Drawing Sheets

IMAGE SENSOR DEVICE AND METHOD

This application claims the benefit of U.S. Provisional Application No. 61/778,170, filed Mar. 12, 2013, and entitled "Photoresist System and Method," which application is hereby incorporated herein by reference.

BACKGROUND

Complementary metal oxide semiconductor image sensors generally utilize a series of photodiodes formed within an array of pixel regions of a semiconductor substrate in order to sense when light has impacted the photodiode. Adjacent to each of the photodiodes within each of the pixel regions a transfer transistor may be formed in order to transfer the signal generated by the sensed light within the photodiode at a desired time. Such photodiodes and transfer transistors allow for an image to be captured at a desired time by operating the transfer transistor at the desired time.

The complementary metal oxide semiconductor image sensors may generally be formed in either a front side illumination configuration or a back-side illumination configuration. In a front-side illumination configuration light passes to the photodiode from the "front" side of the image sensor where the transfer transistor has been formed. However, in this configuration the light is forced to pass through metal layers, dielectric layers, and past the transfer transistor before it reaches the photodiode. This may generate processing and/or operational issues as the metal layers, dielectric layers, and the transfer transistor may not necessarily be transparent and may block the light as it is trying to reach the photodiode.

In a back-side illumination configuration, the transfer transistor, the metal layers, and the dielectric layers are formed on a the front side of the substrate, and light is allowed to pass to the photodiode from the "back" side of the substrate such that the light hits the photodiode before it reaches the transfer transistor, the dielectric layers, or the metal layers. Such a configuration may reduce the complexity of the manufacturing of the image sensor and its operation.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

Embodiments will be described with respect to a specific context, namely a complementary metal oxide semiconductor (CMOS) back side illuminated image sensor. Other embodiments may also be applied, however, to other image sensors and other semiconductor devices.

Figure 1:
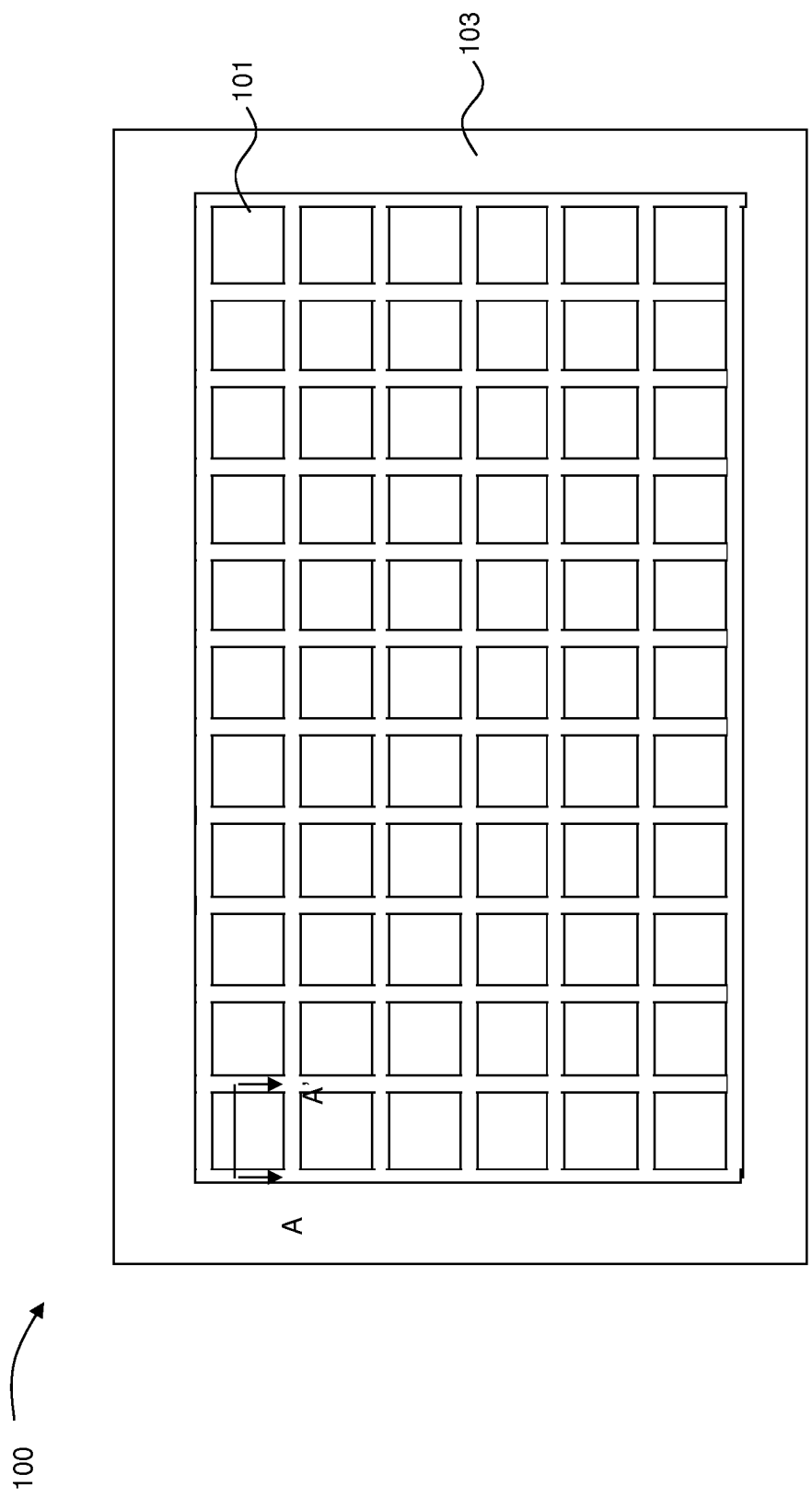
FIG. 1 illustrates an image sensor with an array of pixel regions in accordance with an embodiment.

With reference now to FIG. 1, there is shown an image sensor 100 which comprises a grid or array of a plurality of backside illuminated pixel regions 101. The image sensor 100 also may comprise a logic region 103 located adjacent to the array of pixel regions 101. The logic region 103 may have additional circuitry and contacts for input and output connections to and from the array of pixel regions 101. The logic region 103 is utilized to provide an operating environment for the pixel regions 101 and to moderate communications between the array of pixel regions 101 and other external devices (not shown).

Figure 2:
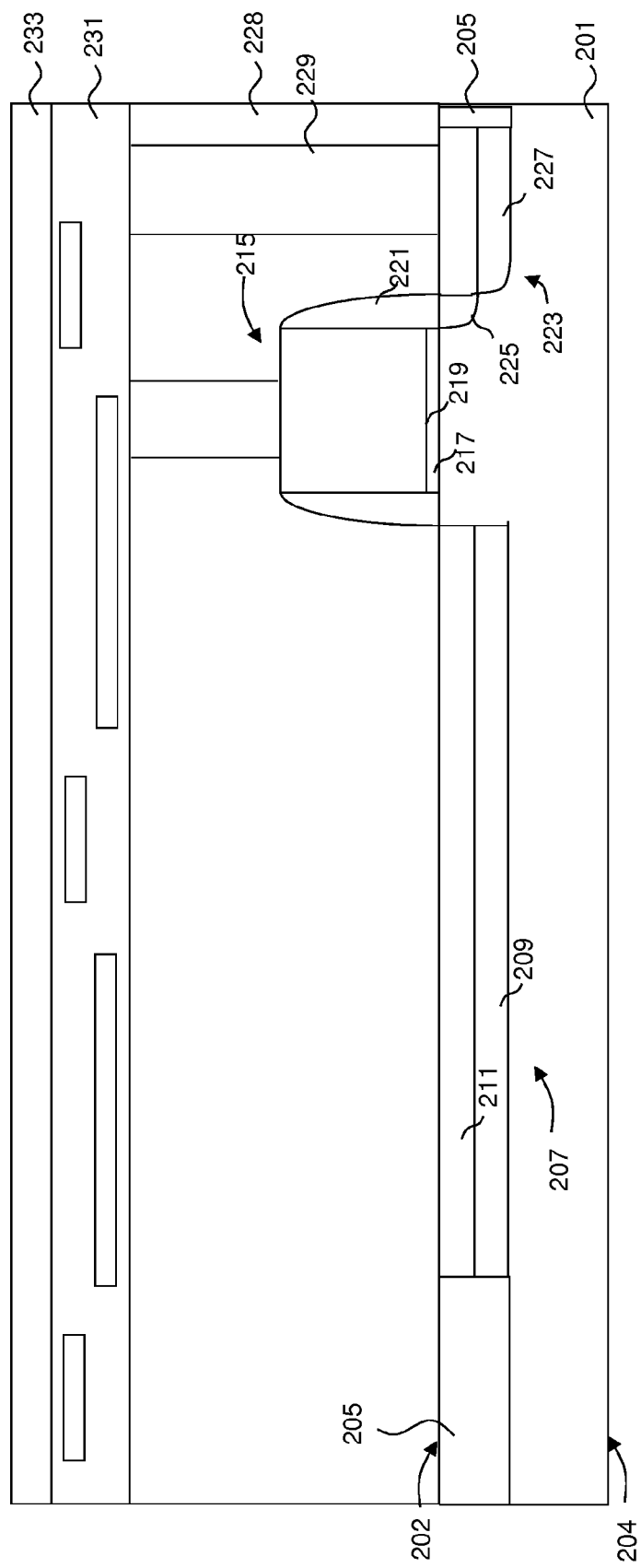
FIG. 2 illustrates a cross-section of one pixel in accordance with an embodiment.

FIG. 2 illustrates a simplified cross sectional view of a pixel region 101 with a transfer transistor 215 through line A-A' in FIG. 1, and shows a substrate 201 with the pixel region 101 separated from other pixel regions 101 by isolation regions 205. The substrate 201 may comprise a front side 202 and a back side 204 and may be a semiconductor material such as silicon, germanium, diamond, or the like, with a crystal orientation of (110). Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used. Additionally, the substrate 201 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 201 may be doped with a p-type dopant, such as boron, gallium, although the substrate may alternatively be doped with an n-type dopant, as is known in the art.

The isolation regions 205 may be located within the substrate 201 around the pixel region 101 in order to separate and isolate the pixel region 101. The isolation regions 205 may be shallow trench isolations generally formed by etching the substrate 201 to form a trench and filling the trench with dielectric material as is known in the art. The isolation regions 205 may be filled with a dielectric material such as an oxide material, a high-density plasma (HDP) oxide, or the like, formed by conventional methods known in the art. Optionally, an oxide liner may be formed along the sidewalls of the isolation regions 205.

A photosensitive diode 207 may be formed in the pixel region 101 of the substrate 201. The photosensitive diode 207 may be utilized to generate a signal related to the intensity or brightness of light that impinges on the photosensitive diode 207. In an embodiment the photosensitive diode 207 may comprise n-type doped region 209 formed in the substrate 201 (which in this embodiment may be a p-type substrate) and also may comprise heavily doped p-type doped region 211 formed on the surface of the n-type doped region 209 to form a p-n-p junction.

The n-type doped region 209 may be formed, e.g., using a photolithographic masking and implantation process. For example, a first photoresist (not shown in FIG. 2) may be placed on the substrate 201. The first photoresist may comprise a conventional photoresist material, such as a deep ultra-violet (DUV) photoresist, and may be deposited on the surface of the substrate 201, for example, by using a spin-on process to place the first photoresist. However, any other suitable material or method of forming or placing the first photoresist may alternatively be utilized. Once the first photoresist has been placed on the substrate 201, the first photoresist may be exposed to energy, e.g. light, through a patterned reticle in order to induce a reaction in those portions of the first photoresist exposed to the energy. The first photoresist may then be developed, and portions of the first photoresist may be removed, exposing a portion of the substrate 201 where the photosensitive diode 207 is desired to be located.

Once the first photoresist has been placed and developed, the heavily doped n-type doped region 209 may be formed by implanting n-type dopants (e.g., phosphorous, arsenic, antimony, or the like) through the first photoresist. In an embodiment the n-type doped region 209 may be implanted such that its concentration is between about 1e15 atom/cm$^3$ and about 1e20 atom/cm$^3$, such as about 8e15 atom/cm$^3$. However, any suitable alternative concentration for the heavily doped n-type doped region 209 may alternatively be utilized.

After the n-type doped region 209 has been formed (e.g., through the implantation process), the p-type doped region 211 may be formed using, e.g., an ion implantation process using the first photoresist as a mask. The p-type doped region 211 may be formed to extend into the substrate 201 between about 1 μm and about 4 μm. Additionally, the p-type doped region 211 may be formed to have a concentration of between about 1e15 atom/cm$^3$ and about 5e19 atom/cm$^3$, such as about 1e16 atom/cm$^3$.

Once the photosensitive diode 207 has been formed, the first photoresist may be removed. In an embodiment, the first photoresist may be removed using a process such as ashing. In such a process the temperature of the first photoresist is increased to a point where the first photoresist will decompose and then rinsed or otherwise removed from the substrate 201.

Further, as one of ordinary skill in the art will recognize, the photosensitive diode 207 described above is merely one type of photosensitive diode 207 that may be used in the embodiments. Any suitable photodiode may be utilized with the embodiments, and all of these photodiodes are intended to be included within the scope of the embodiments. Additionally, the precise methods or order of steps described above may be modified, such as by forming the p-type doped region 211 prior to the formation of the n-type doped region 209, while still remaining within the scope of the embodiments.

The transfer transistor 215 may be formed in the pixel region 101. However, while the transfer transistor 215 is described as a transfer transistor, the transfer transistor 215 is also merely representative of the many types of functional transistors that may be utilized within the image sensor. For example, embodiments may additionally include other transistors located within the pixel region 101, such as reset transistors, source follower transistors, or select transistors. These transistors may be arranged, for example, to form a four transistor CMOS image sensor (CIS). All suitable transistors and configurations that may be utilized in an image sensor are fully intended to be included within the scope of the embodiments.

The transfer transistor 215 may comprise a gate stack that may be formed over the substrate 201. The gate stack may comprise a gate dielectric 217 and a gate electrode 219. The gate dielectric 217 and gate electrode 219 may be formed and patterned on the substrate 201 by any suitable process known in the art. The gate dielectric 217 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. The gate dielectric 217 may have a relative permittivity value greater than about 4.

In an embodiment in which the gate dielectric 217 comprises an oxide layer, the gate dielectric 217 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In one embodiment, the gate dielectric 217 may be between about 10 Å to about 150 Å in thickness, such as 100 Å in thickness.

The gate electrode 219 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrode 219 is poly-silicon, the gate electrode 219 may be formed by depositing doped or undoped poly-silicon by low-pressure chemical vapor deposition (LPCVD) to a thickness in the range of about 100 Å to about 2,500 Å, such as 1,200 Å.

Spacers 221 may be formed on the sidewalls of the gate dielectric 217 and the gate electrode 219. The spacers 221 may be formed by blanket depositing a spacer layer (not shown) on the previously formed structure. The spacer layer may comprise SiN, oxynitride, SiC, SiON, oxide, and the like, and may be formed by commonly used methods such as chemical vapor deposition (CVD), plasma enhanced CVD, sputter, and other methods known in the art. The spacer layer is then patterned to form the spacers 221, such as by anisotropically etching to remove the spacer layer from the horizontal surfaces of the structure.

The source/drain region 223 may be formed in the substrate 201 on an opposing side of the gate dielectric 217 from the photosensitive diode 207. In an embodiment in which the substrate 201 is a p-type substrate, the source/drain region 223 may be formed by implanting appropriate n-type dopants such as phosphorous, arsenic or antimony. The source/drain region 223 may be implanted using the gate electrode 219 and the spacers 221 as masks to form a lightly doped source/drain (LDD) region 225 and a heavily doped source/drain region 227.

It should be noted that one of ordinary skill in the art will realize that many other processes, steps, or the like may be used to form the source/drain region 223 and the photosensitive diode 207. For example, one of ordinary skill in the art will realize that a plurality of implants may be performed using various combinations of spacers and liners to form the source/drain region 223 and the photosensitive diode 207 having a specific shape or characteristic suitable for a particular purpose. Any of these processes may be used to form the source/drain region 223 and the photosensitive diode 207, and the above description is not meant to limit the embodiments to the steps presented above.

Once the transfer transistor 215 has been formed, a first inter-layer dielectric (ILD) layer 228 may be formed over the pixel region 101 and contacts 229 may be formed through the first ILD layer 228. The first ILD layer 228 may comprise a material such as boron phosphorous silicate glass (BPSG), although any suitable dielectrics may be used for either layer. The first ILD layer 228 may be formed using a process such as PECVD, although other processes, such as LPCVD, may alternatively be used. The first ILD layer 228 may be formed to a thickness of between about 100 Å and about 3,000 Å.

The contacts 229 may be formed through the first ILD layer 228 with suitable photolithography and etching techniques. In an embodiment a second photoresist material is utilized to create a patterned mask to define contacts 229. Additional masks, such as a hardmask, may also be used. An etching process, such as an anisotropic or isotropic etch process, is performed to etch the first ILD layer 228.

Contacts 229 may then be formed so as to contact the substrate 201 and the gate electrode 219. The contacts 229 may comprise a barrier/adhesion layer (not individually shown in FIG. 2) to prevent diffusion and provide better adhesion for the contacts 229. In an embodiment, the barrier layer is formed of one or more layers of titanium, titanium nitride, tantalum, tantalum nitride, or the like. The barrier layer may be formed through chemical vapor deposition, although other techniques could alternatively be used. The barrier layer may be formed to a combined thickness of about 50 Å to about 500 Å.

The contacts 229 may be formed of any suitable conductive material, such as a highly-conductive, low-resistive metal, elemental metal, transition metal, or the like. In an exemplary embodiment the contacts 229 are formed of tungsten, although other materials, such as copper, could alternatively be utilized. In an embodiment in which the contacts 229 are formed of tungsten, the contacts 229 may be deposited by CVD techniques known in the art, although any method of formation could alternatively be used.

After the contacts 229 are formed, further processing of the front side 202 of the substrate 201 may be performed. This processing may comprise forming various conductive and dielectric layers (collectively referred to in FIG. 2 by the reference number 231) in order to form interconnections between the individually formed devices to each other. These interconnections may be made through any suitable formation process (e.g., lithography with etching, damascene, dual damascene, or the like) and may be formed using suitable conductive materials such as aluminum alloys, copper alloys, or the like.

Additionally, once the interconnections have been formed over the first ILD layer 228, a first passivation layer 233 may be formed in order to protect the underlying layers from physical and chemical damage. The first passivation layer 233 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 233 may be formed through a process such as chemical vapor deposition (CVD), although any suitable process may be utilized.

Figure 3:
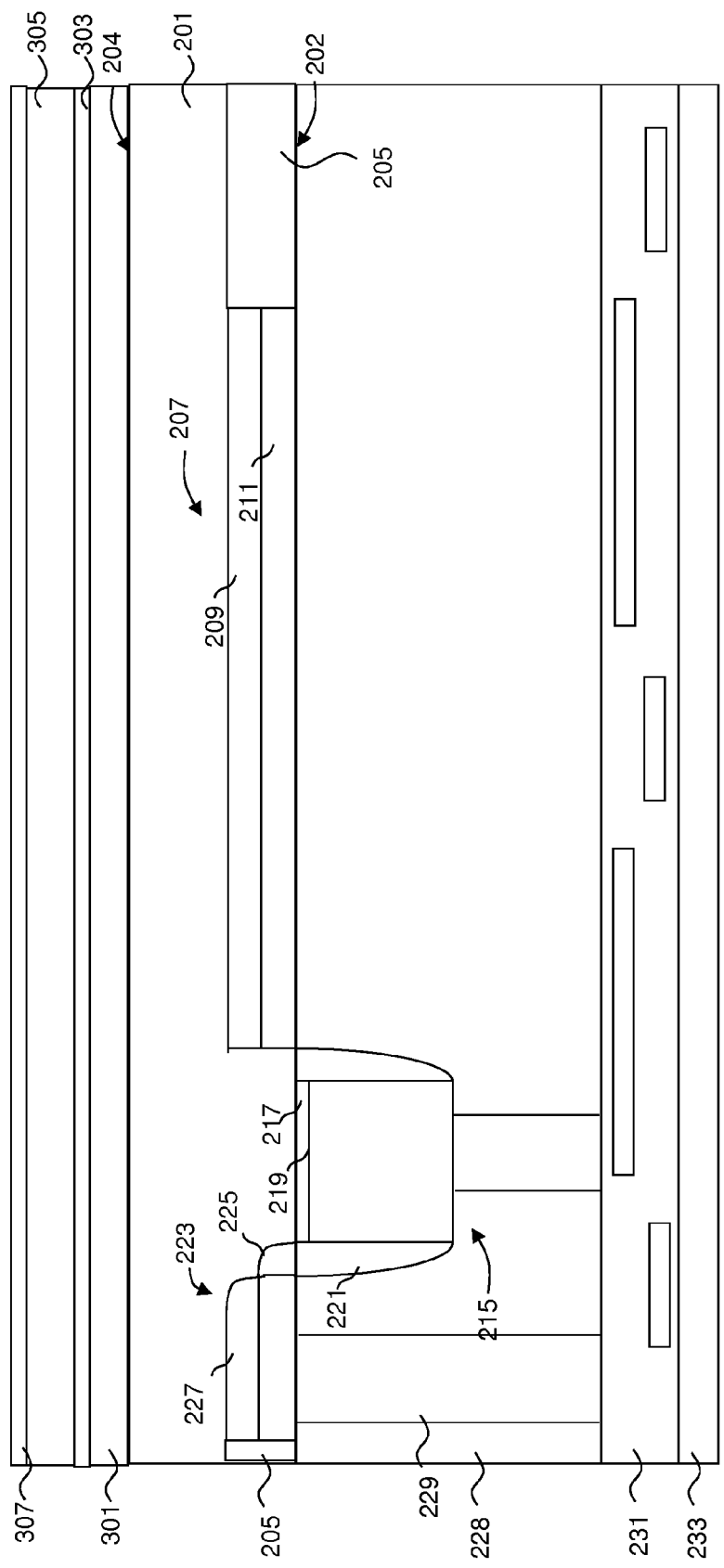
FIG. 3 illustrates a formation of a optical block layer and a glue layer in accordance with an embodiment.

FIG. 3 illustrates further processing on the back side 204 of the substrate 201 that may be performed after the processing on the front side 202 of the substrate 201. In an embodiment the thickness of the back side 204 of the substrate 201 may reduced, or thinned. Thinning reduces the distance that light travels through the back side 204 of the substrate 201 before it reaches the photosensitive diode 207. The thinning of the back side 204 of the substrate 201 may be performed using a removal process such as chemical mechanical polishing (CMP). In a CMP process, a combination of etching materials and abrading materials are put into contact with the back side 204 of the substrate 201 and a grinding pad (not shown) is used to grind away the back side 204 of the substrate 201 until a desired thickness is achieved. However, any suitable process for thinning the back side 204 of the substrate 201, such as etching or a combination of CMP and etching, may alternatively be used. The back side 204 of the substrate 201 may be thinned so that the substrate 201 has a thickness of between about 2 μm and about 2.3 μm.

FIG. 3 also illustrates the formation of a second passivation layer 301 over the back side 204 of the substrate 201. The second passivation layer 301 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The second passivation layer 301 may be formed through a process such as chemical vapor deposition (CVD), although any suitable process may be utilized to a thickness of between about 100 Å and about 6,000 Å, such as about 2,000 Å.

Additionally illustrated in FIG. 3 is the formation of a first glue layer 303, a first optical block layer 305, and a second glue layer 307. In an embodiment the first glue layer 303 may be a material to help the first optical block layer 305 adhere to the second passivation layer 301 and helps to balances the stresses within the processes. The first glue layer 303 may comprise a material such as titanium nitride, tantalum nitride, a nitride film, oxynitride, combinations of these, or the like. The first glue layer 303 may be formed using a deposition process such as chemical vapor deposition (CVD), physical vapor deposition (PVD), atomic layer deposition (ALD), combinations of these, or the like, and may be formed to a thickness of between about 10 Å and about 1,000 Å, such as about 100 Å.

The first optical block layer 305 is formed over the first glue layer 303 and is utilized to prevent the transfer of light through the first optical block layer 305 to areas where light is undesired. In an embodiment the first optical block layer 305 is formed of an opaque material such as aluminum copper, tungsten, zinc, nickel, cobalt, combinations, or these, or the like, and may be formed using a process such as physical vapor deposition, chemical vapor deposition, plating, electroless plating, combinations of these, or the like. The first optical block layer 305 may be formed to a thickness of between about 10 Å and about 4,000 Å, such as about 750 Å.

FIG. 3 also illustrates the formation of a second glue layer 307 over the first optical block layer 305. The second glue layer 307 may be formed over the first optical block layer 305 and may be used to adhere the second optical block layer 401 (not illustrated in FIG. 3 but illustrated and described below with respect to FIG. 4) to the first optical block layer 305. In an embodiment the second glue layer 307 may be formed of a similar material and using similar processes as the first glue layer 303 (e.g., titanium nitride formed using CVD), and may be formed to a similar thickness (e.g., 100 Å). However, in alternative embodiments the second glue layer 307 may be a different material than the first glue layer 303 and may be formed using different processes.

During further processing of the image sensor 100, the first optical block layer 305 will undergo a series of thermal cycles, first being heated up (using, e.g., a thermal anneal) and then being cooled down. This cycling will also cause the first optical block layer 305 to expand and contract in relation to its coefficient of thermal expansion. Such expansion and contraction can cause undesirable voids (not illustrated in FIG. 3 but illustrated and described further below with respect to FIG. 7) to form that allows light to pass through the first optical block layer 305 in undesired spots.

Figure 4:
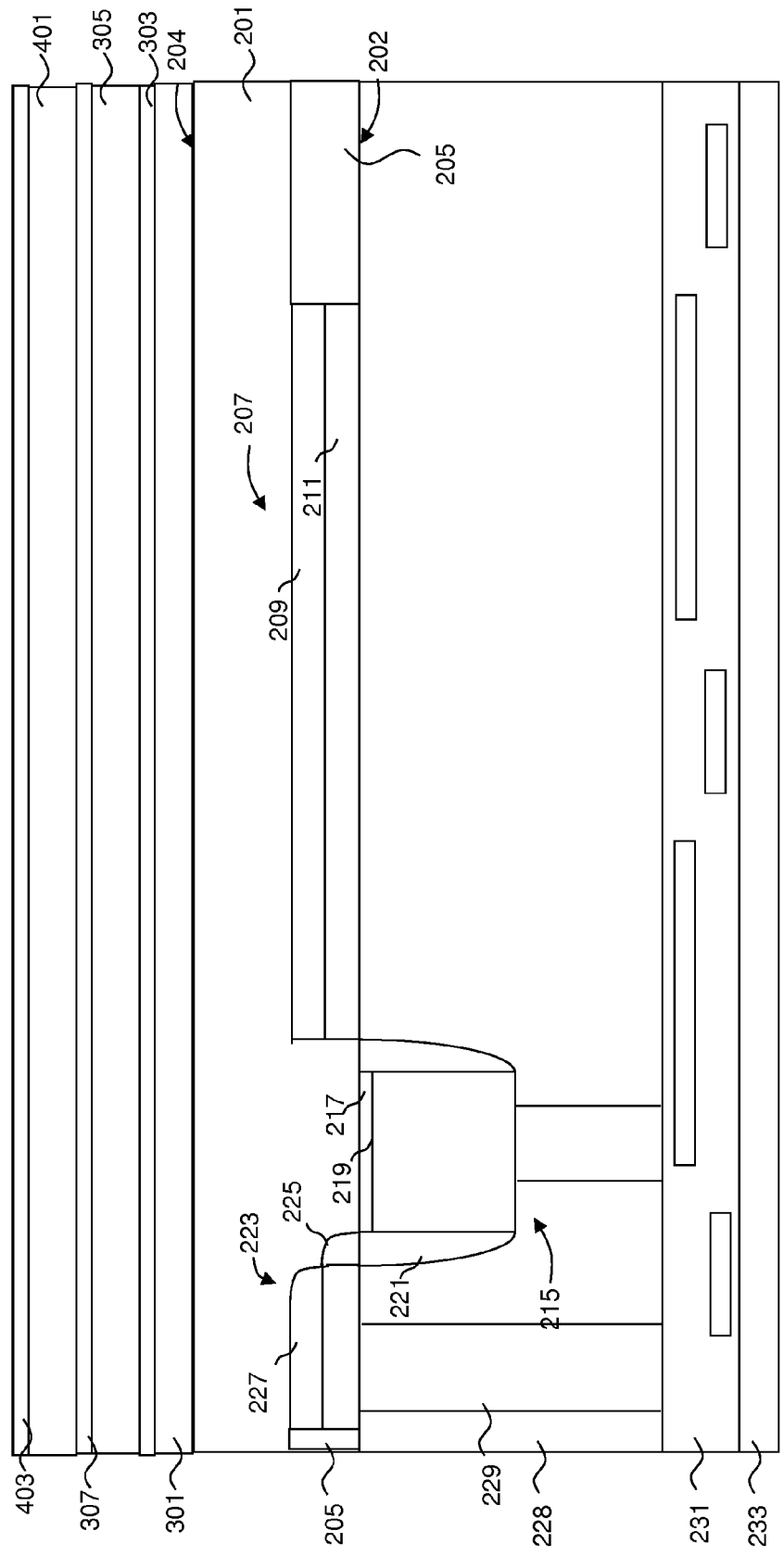
FIG. 4 illustrates a first repetition of the formation of the optical block layer and the glue layer in accordance with an embodiment.

As a means of preventing this light from passing through to the substrate 201, FIG. 4 illustrates a repetition of the formation of the first optical block layer 305 and the second glue layer 307 to form a second optical block layer 401 and a third glue layer 403. In an embodiment the second optical block layer 401 may be formed over the second glue layer 307 to help reduce or eliminate the passage of light. In an embodiment the second optical block layer 401 may be formed of similar materials and using similar processes as the first optical block layer 305 (e.g., aluminum copper using chemical vapor deposition) to a similar thickness (e.g., 750 Å). However, in alternative embodiments the second optical block layer 401 may be formed using different processes and different materials, and may be formed to a different thickness than the first optical block layer 305.

The third glue layer 403 may be formed over the second optical block layer 401 and may be formed with similar materials, similar processes, and to similar thicknesses as the second glue layer 307 (e.g., titanium nitride using chemical vapor deposition). However, in alternative embodiments the third glue layer 403 may be formed with different materials, different processes, and to different thicknesses than the second glue layer 307.

Figure 5:
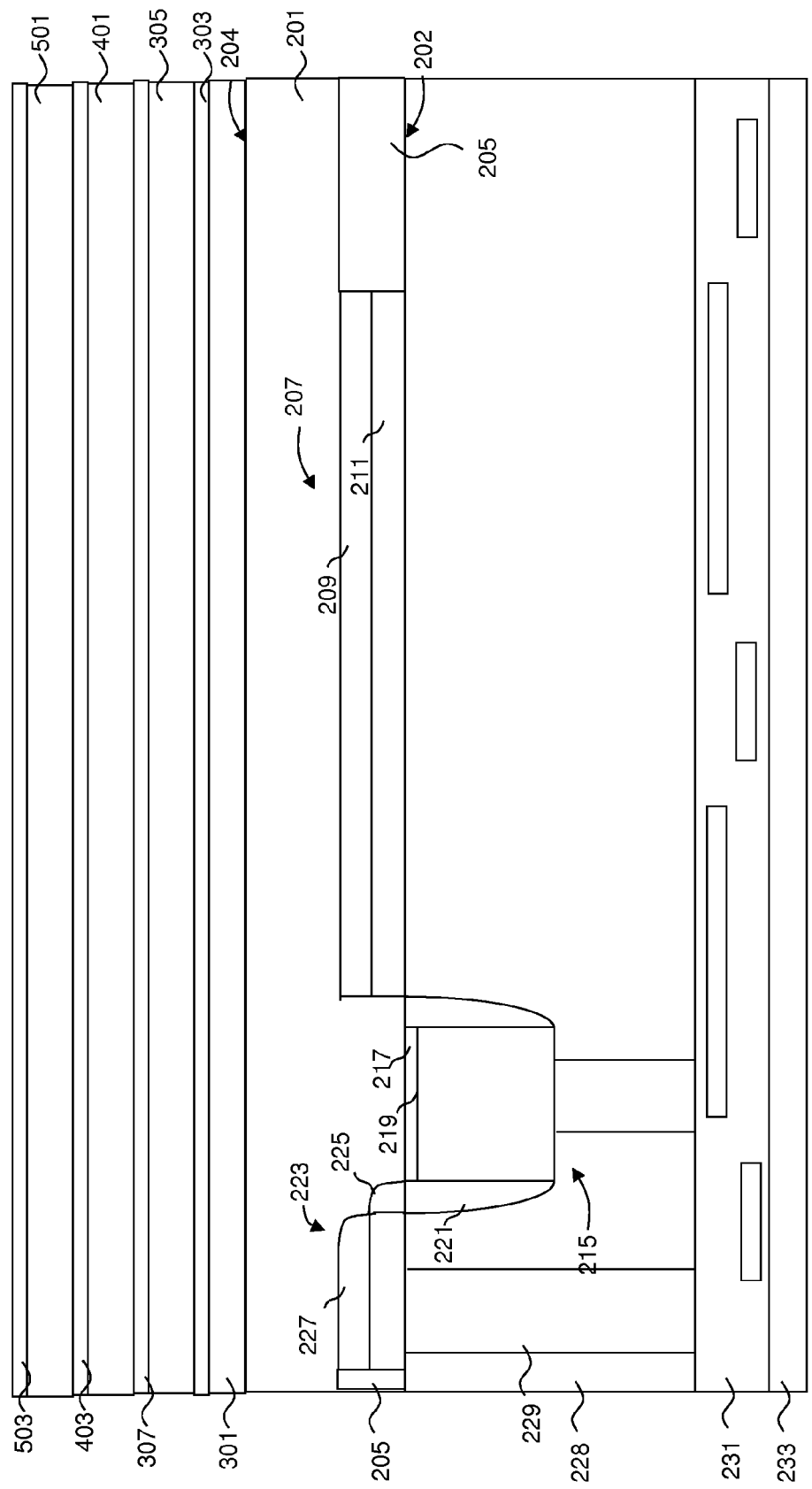
FIG. 5 illustrates a second repetition of the formation of the optical block layer and the glue layer in accordance with an embodiment.

FIG. 5 illustrates another repetition of the formation of the first optical block layer 305 and the second glue layer 307 to form a third optical block layer 501 and a fourth glue layer 503 over the third glue layer 403. In an embodiment the third optical block layer 501 may be formed of similar materials and using similar processes as the first optical block layer 305 (e.g., aluminum copper using chemical vapor deposition) to a similar thickness (e.g., 750 Å). However, in alternative embodiments the third optical block layer 501 may be formed using different processes and different materials, and may be formed to a different thickness than the first optical block layer 305.

Additionally, while FIG. 4 and FIG. 5 illustrate a first repetition and a second repetition of the formation of optical block layers and glue layers, embodiments are not intended to be limited to only a first and a second repetition of these steps. Rather, any suitable number of repetitions may alternatively be utilized, such as repeating the steps three, four, five, or more times to form additional optical block layers and glue layers. All such number of repetitions are fully intended to be included within the scope of the embodiments.

Figure 6:
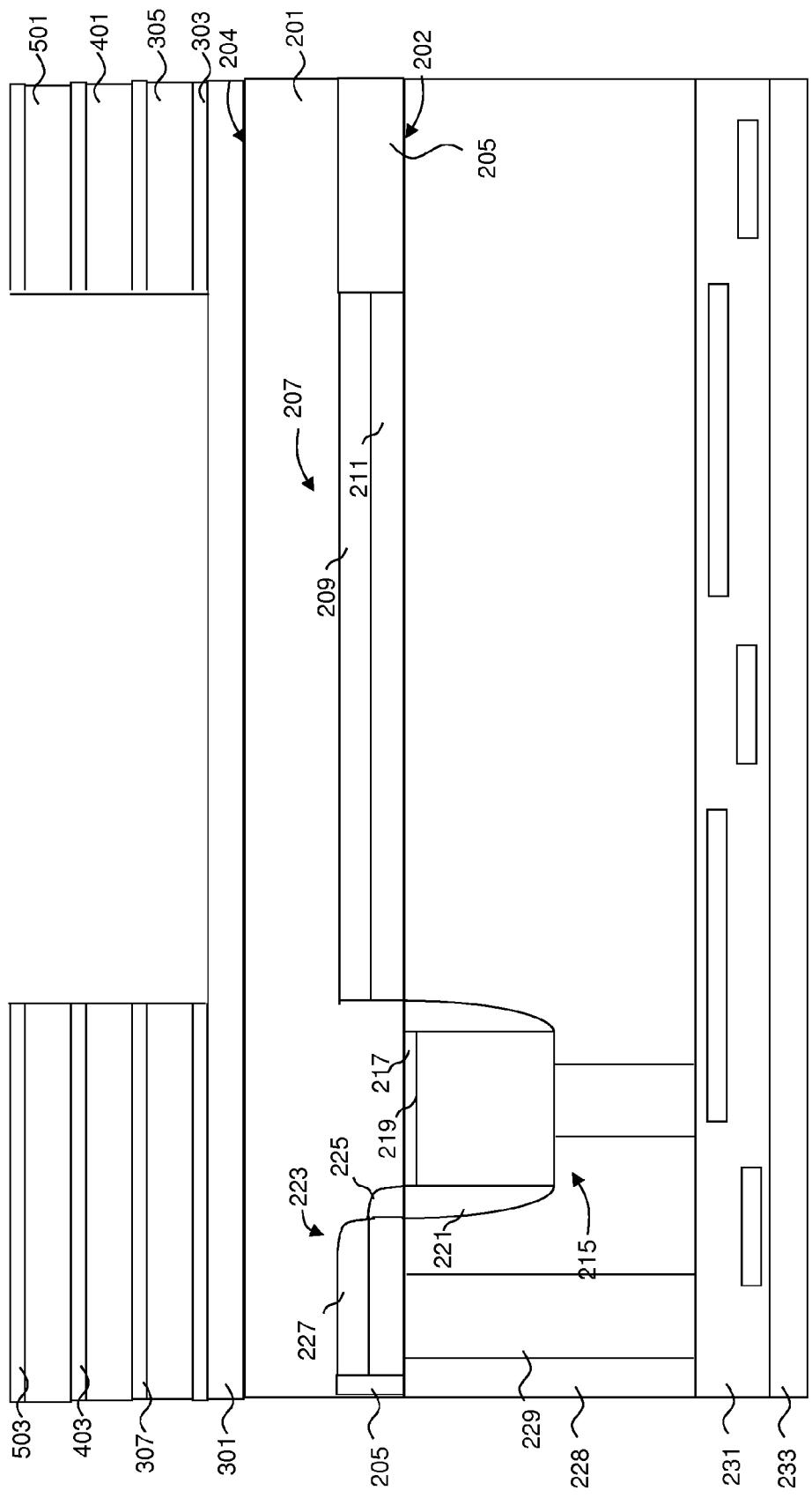
FIG. 6 illustrates a formation of an opening through the optical block layers and the glue layers in accordance with an embodiment.

FIG. 6 illustrates a patterning of the first glue layer 303, the first optical block layer 305, the second glue layer 307, the second optical block layer 401, the third glue layer 403, the third optical block layer 501, and the fourth glue layer 503. The patterning may be performed using, e.g., a suitable photolithographic masking and etching process. In such a process a third photoresist (not shown in FIG. 6) may be placed on the fourth glue layer 503. The third photoresist may comprise a conventional photoresist material, such as a deep ultra-violet (DUV) photoresist, and may be deposited on the surface of the fourth glue layer 503, for example, by using a spin-on process to place the third photoresist. However, any other suitable material or method of forming or placing the third photoresist may alternatively be utilized. Once the third photoresist has been placed on the fourth glue layer 503, the third photoresist may be exposed to energy, e.g. light, through a patterned reticle in order to induce a reaction in those portions of the third photoresist exposed to the energy. The third photoresist may then be developed, and portions of the third photoresist may be removed, exposing a surface of the fourth glue layer 503.

Once the third photoresist is in place, portions of the first glue layer 303, the first optical block layer 305, the second glue layer 307, the second optical block layer 401, the third glue layer 403, the third optical block layer 501, and the fourth glue layer 503 over the photosensitive diode 207 may be removed to allow for light to pass to the photosensitive diode 207 within the pixel while leaving portions of the first glue layer 303, the first optical block layer 305, the second glue layer 307, the second optical block layer 401, the third glue layer 403, the third optical block layer 501, and the fourth glue layer 503 over the remainder of the pixel to prevent the passage of light. In an embodiment in which the first optical block layer 305 is aluminum copper and the first glue layer 303 is titanium nitride, the removal may be performed using a suitable etching process or combination of etching processes, such as an anisotropic etch using an etchant such as HF, although any other suitable removal process may be alternatively utilized.

Once the first glue layer 303, the first optical block layer 305, the second glue layer 307, the second optical block layer 401, the third glue layer 403, the third optical block layer 501, and the fourth glue layer 503 have been patterned, the third photoresist may be removed. In an embodiment, the third photoresist may be removed using a process such as ashing. In such a process the temperature of the third photoresist is increased to a point where the third photoresist will decompose and then rinsed or otherwise removed from the substrate 201.

After the third photoresist has been removed, the second side 204 of the substrate 201 may be further processed in order to provide additional functionality. For example, color filters (not illustrated) such as polymeric resin placed using a spin-coating process, may be formed over the pixel region 101 in order to filter light that will impinge upon the pixel region 101. Additionally, a microlens may be formed by applying and then baking a positive type photoresist in order to focus impinging light upon the photosensitive diode 207. These and any other suitable structures to aid in the gathering, focusing, filtering, or otherwise handle incoming light may be formed, and all such structures are fully intended to be included within the scope of the embodiments.

Figure 7:
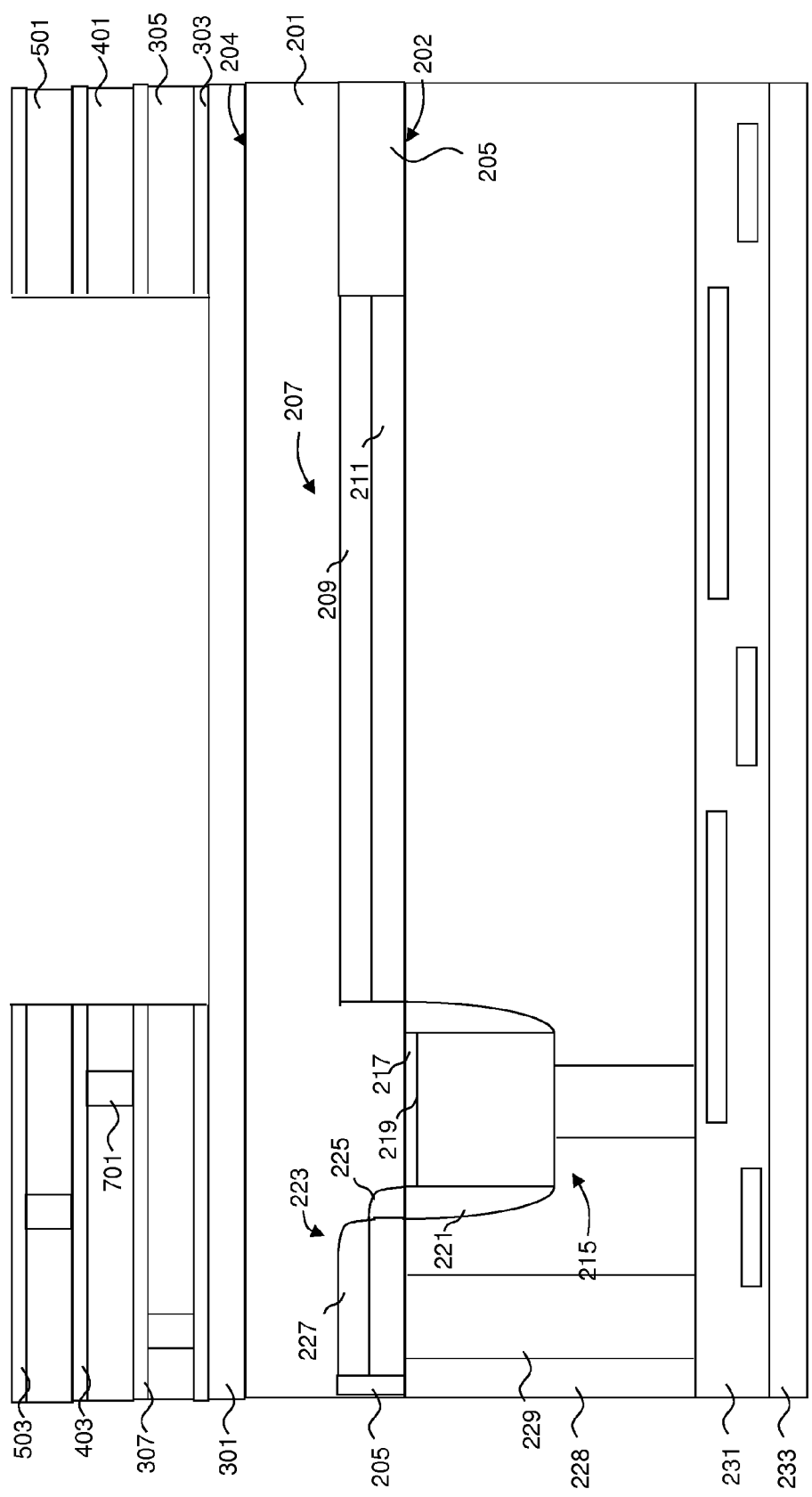
FIG. 7 illustrates a formation of voids within the optical block layers in accordance with an embodiment.

FIG. 7 illustrates the image sensor 100 after the image sensor 100 has experienced multiple thermal cycles, wherein the thermal cycles may occur due to either further processing (e.g., a thermal anneal) or else thermal cycles from usage by an end user. As illustrated, the thermal processing has caused the first optical block layer 305 to expand and contract, causing undesired voids 701 to open within the first optical block layer 305 which may allow light to pass through the first optical block layer 305.

However, the presence of the second optical block layer 401 and the third optical block layer 501 helps to reduce or eliminate the passage of light. In particular, while the second optical block layer 401 and the third optical block layer 501 may experience similar expansions and contractions and may experience a similar formation of voids 701, there is a low likelihood that the voids formed in either the second optical block layer 401 and the third optical block layer 501 are formed directly over the voids 701 formed in the first optical block layer 305. As such, any light that would have otherwise passed through the voids 701 in the first optical block layer 305 are stopped by the second optical block layer 401 or the third optical block layer 501. Further, any light that passes through the second optical block layer 401 or the third optical block layer 501 is stopped by the first optical block layer 305. Such back-up layers help to prevent light leakage and helps the black level calibration.

In accordance with an embodiment, a semiconductor device comprising a pixel is provided. The pixel comprises a substrate and a photodiode within the substrate. A first optical block layer is over the substrate, and a second optical block layer is over the first optical block layer, the second optical block layer being separated from the first optical block layer. An opening is through the first optical block layer and the second optical block layer to allow light to impinge upon the photodiode.

In accordance with another embodiment, a semiconductor device comprising a light blocking layer over a substrate is provided. The light blocking layer comprises a repeating pattern of a optical block layer and a glue layer. An opening is located through the light blocking layer, the opening exposing the substrate over a photodiode located within the substrate.

In accordance with yet another embodiment, a method of manufacturing a semiconductor device comprising forming a blocking layer over a substrate is provided. The forming the blocking layer further comprises forming a optical block layer over the substrate and forming a glue layer over the optical block layer. The forming the blocking layer is repeated one or more times to form a blocking region and a portion of the blocking region is removed to expose the substrate over a photodiode located within the substrate.

Although the present embodiments and their advantages have been described in detail, it should be understood that various changes, substitutions and alterations can be made herein without departing from the spirit and scope of the embodiments as defined by the appended claims. For example, charge coupled devices (CCD) may be utilized in place of the CMOS devices within the image sensor, and the image sensor may be a front side image sensor instead of a back side image sensor. These devices, steps and materials may be varied while remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
   a pixel comprising a substrate and a photodiode within the substrate, the substrate having a first side and a second side opposite the first side, the photodiode below a portion of the substrate and sharing an interface with the first side of the substrate, wherein the substrate comprises a semiconductor material throughout the substrate;
   a first optical block layer above the second side of the substrate, wherein the first optical block layer comprises aluminum copper;
   a second optical block layer over the first optical block layer, the second optical block layer being separated from the first optical block layer;
   a first glue layer between the first optical block layer and the second optical block layer, wherein the first glue layer comprises titanium nitride; and
   an opening through the first optical block layer and the second optical block layer to allow light to impinge upon the photodiode.

2. The semiconductor device of claim 1, further comprising a second glue layer between the first optical block layer and the substrate.

3. The semiconductor device of claim 2, further comprising a third glue layer over the second optical block layer.

4. The semiconductor device of claim 3, further comprising a third optical block layer over the third glue layer.

5. The semiconductor device of claim 4, further comprising a fourth glue layer over the third optical block layer.

6. A semiconductor device comprising:
   a light blocking layer adjacent to a first side of a substrate, wherein the light blocking layer comprises a repeating pattern of a optical block layer and a glue layer, wherein the substrate is semiconductor material, and wherein the glue layer comprises titanium nitride; and
   an opening through the light blocking layer, the opening exposing the substrate over a photodiode located within the substrate, the photodiode being adjacent to a second side of the substrate opposite the first side of the substrate, wherein the photodiode is arranged within the substrate in a back side illuminated image sensor configuration.

7. The semiconductor device of claim 6, wherein the repeating pattern has a first optical block layer and a second optical block layer.

8. The semiconductor device of claim 6, wherein the repeating pattern has a first optical block layer, a second optical block layer, and a third optical block layer.

9. The semiconductor device of claim 8, wherein the repeating pattern has a first glue layer, a second glue layer, a third glue layer, and a fourth glue layer.

10. The semiconductor device of claim 6, wherein the optical block layer comprises aluminum copper.

11. The semiconductor device of claim 6, further comprising a passivation layer between the repeating pattern and the substrate.

12. A method of manufacturing a semiconductor device, the method comprising:
    forming a blocking layer over a substrate, wherein the forming the blocking layer further comprises:
      forming a optical block layer over the substrate; and
      forming a glue layer over the optical block layer, wherein the glue layer comprises titanium nitride;
    repeating the forming the blocking layer one or more times to form a blocking region; and
    removing a portion of the blocking region to expose the substrate over a photodiode located along an opposite side of a semiconductor portion of the substrate than the optical block layer.

13. The method of claim 12, wherein the repeating the forming the blocking layer comprises repeating the forming the blocking layer one time.

14. The method of claim 12, wherein the repeating the forming the blocking layer comprises repeating the forming the blocking layer two times.

15. The method of claim 12, further comprising forming a passivation layer over the substrate prior to the forming the blocking layer.

16. The method of claim 15, further comprising forming a first glue layer over the passivation layer prior to the forming the blocking layer.

17. The method of claim 12, wherein the forming the optical block layer forms a layer of aluminum copper.

18. The semiconductor device of claim 1, further comprising a passivation layer between the substrate and the first optical block layer.

19. The semiconductor device of claim 1, further comprising a plurality of pixels located in a pixel region.

20. The semiconductor device of claim 1, wherein the pixel is a first pixel, the semiconductor device further comprising a second pixel and an isolation region separating the first pixel and the second pixel.

* * * * *